US011169199B2

(12) United States Patent
Zhang et al.

(10) Patent No.: US 11,169,199 B2
(45) Date of Patent: Nov. 9, 2021

(54) METHOD AND DEVICE FOR ONLINE INSULATION MONITORING OF MOTOR

(71) Applicants: Tsinghua University, Beijing (CN); Envision Energy (Jiangsu) Co., Ltd., Jiangyin (CN)

(72) Inventors: Pinjia Zhang, Beijing (CN); Dayong Zheng, Beijing (CN); Hongdong Zhu, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 36 days.

(21) Appl. No.: 16/850,830

(22) Filed: Apr. 16, 2020

(65) Prior Publication Data
US 2020/0271713 A1    Aug. 27, 2020

(30) Foreign Application Priority Data
Aug. 9, 2019  (CN) .......................... 201910736509.5

(51) Int. Cl.
*G01R 31/12*  (2020.01)
*G01R 31/34*  (2020.01)

(52) U.S. Cl.
CPC ....... *G01R 31/1272* (2013.01); *G01R 31/343* (2013.01)

(58) Field of Classification Search
CPC .. G01R 31/1272; G01R 31/343; G01R 31/52; G01R 31/34; G01R 31/1227; G01R 27/2617

USPC ................................... 324/765.01, 551, 557
See application file for complete search history.

(56) References Cited

U.S. PATENT DOCUMENTS

| | | | | |
|---|---|---|---|---|
| 2001/0048310 A1* | 12/2001 | Takahashi | ............ | G01R 31/346 324/551 |
| 2014/0084937 A1* | 3/2014 | Neti | ...................... | G01R 31/343 324/510 |
| 2020/0241081 A1* | 7/2020 | Zhang | ..................... | G01R 31/62 |

* cited by examiner

*Primary Examiner* — Tung X Nguyen
*Assistant Examiner* — Robert P Alejnikov, Jr.
(74) *Attorney, Agent, or Firm* — Dragon Sun Law Firm, PC; Jinggao Li, Esq.

(57) ABSTRACT

A method and device for online insulation monitoring of a motor are applied to an inverter-driven motor system. The method includes: measuring phase-to-ground voltages of three-phase inlet lead ends of a motor; acquiring leakage currents of the three-phase inlet lead ends of the motor; acquiring a voltage common-mode component, a voltage differential-mode component, a current common-mode component and a current differential-mode component from the phase-to-ground voltages and the leakage currents; and acquiring ground-wall insulation equivalent capacitance and phase-to-phase insulation equivalent capacitance according to the components. A ground-wall insulation monitoring result and a phase-to-phase insulation monitoring result are distinguished from each other by the acquired ground-wall insulation equivalent capacitance and phase-to-phase insulation equivalent capacitance, such that two kinds of insulation are monitored respectively. Thus, the accuracy of an online insulation monitoring result of a stator and the monitoring reliability are improved.

17 Claims, 3 Drawing Sheets

METHOD AND DEVICE FOR ONLINE INSULATION MONITORING OF MOTOR

CROSS-REFERENCE TO RELATED PATENT APPLICATION

This application claims priority to and the benefit of CN201910736509.5, filed Aug. 10, 2019 entitled "METHOD AND DEVICE FOR ONLINE INSULATION MONITORING OF MOTOR," by Pinjia Zhang et al. The entire disclosure of the above-identified application is incorporated herein by reference.

Some references, which may include patents, patent applications, and various publications, are cited and discussed in the description of the present disclosure. The citation and/or discussion of such references is provided merely to clarify the description of the present disclosure and is not an admission that any such reference is "prior art" to the present disclosure described herein. All references cited and discussed in this specification are incorporated herein by reference in their entireties and to the same extent as if each reference was individually incorporated by reference.

TECHNICAL FIELD

The present invention relates to the field of motors, in particular to the field of online insulation monitoring of motors, and more particularly to a method and device for online insulation monitoring of a stator, applied to an inverter-driven motor.

BACKGROUND

A motor is one of the core equipment of power equipment in the industry. A motor failure will cause damages to the equipment, and unplanned downtime brought thereby will result in more negative impacts, which threatens the safety and the stability of a power grid and leads to corresponding economic losses. Taking wind power as an example, with a large number of wind turbines assembled in recent years, operation and maintenance of these assembled wind turbines have become more and more important.

For an AC motor, the common faults include stator insulation faults, shaft faults and rotor faults. Taking an offshore oil production platform as an example, a downtime loss caused by a motor failure can reach $25,000 per hour. According to surveys, 30% to 40% of AC motor failures are related to stators, and 60% to 70% of high-voltage motor failures are caused by insulation failures of stators. Therefore, there is an important economic value to timely discovery of potential insulation failures of motor stators.

The motor fault monitoring technology has undergone the development stages of breakdown maintenance, preventive maintenance and online monitoring. Maintenance after a failure will result in a high cost because the equipment will be damaged during the failure, and unexpected downtime will bring a ripple effect. A commonly used method is to have periodic preventive maintenance. Traditional offline stator insulation fault preventive test technologies have been widely used. DL/T596-1996 "Preventive Test Code for Electric Power Equipment" has played a guiding role in preventive experiments on electric power equipment in various electric power departments of China. The frequently-used offline detection methods for AC motors include measurements of insulation resistance and polarization index of windings, measurements of DC resistance of the windings, measurements of leakage currents, DC over-voltage test, AC overvoltage test of the stator windings, etc. In addition, commonly used detection methods include offline partial discharge detection and dielectric loss angle tangent test.

However, the traditional regular offline maintenance has the following deficiencies: normal work is interrupted by the request for a power cut; after the power cut, an operation condition of the equipment will change to be different from the online operation condition, which affects the correctness of diagnosis; only periodic inspection, but not continuous monitoring at any time, is allowed, thus, it is impossible to continuously track an insulation condition; and each detection may cause damage to the equipment, so unnecessary detection is instead harmful to the health of the electric power equipment.

The online monitoring technology can overcome the shortcomings of traditional offline maintenance. Online monitoring is to continuously observe the entire life cycle of the working condition of power equipment by measuring the sound, light, electricity, magnetism, force and temperature signals of the power equipment in real time, and to give an alarm in time before the working condition of the power equipment deteriorates to a failure, so as to reasonably arrange shutdown maintenance for related equipment. In this way, the costs of operation and maintenance are greatly reduced, and the operation safety and reliability of the power equipment are improved.

In recent years, some scholars have proposed that insulation health conditions of the motor stator windings are monitored by online measurements of the dielectric loss angle tangent (tan δ, also called DF, Dissipation Factor) and equivalent capacitance C. An insulation model is as shown in FIG. 1 (a), which can be regarded as a parallel equivalent model of resistance and capacitance. FIG. 1 (b) is a current phase diagram. Insulation leakage current includes capacitive leakage current $I_C$ and resistive leakage current $I_R$, where the resistive leakage current and voltage are in phase, and the capacitive leakage current and voltage are orthogonal. By decomposing the leakage current, the magnitudes of the resistive leakage current and the capacitive leakage current can be obtained, and then the equivalent capacitance C and the dielectric loss angle tangent tan δ can be calculated.

FIG. 2 is an online insulation monitoring method based on differential-mode leakage current [1]. Insulation leakage current and phase voltage are monitored by a current transformer (CT) and a voltage transformer (VT). An inlet lead and an outlet lead of a one-phase motor winding pass through a differential current transformer, such that a magnetic field of a load current $I_a$ during normal operation is canceled, and only the insulation leakage current $I_{a,1}$ is detected by the transformer. However, this method measures the voltage and the leakage current at the power frequency, and the leakage current is very low at this frequency and can only be accurately measured in a grid-connected motor system. Due to serious electromagnetic interference in an inverter system, it is difficult to accurately measure such a low leakage current, and thus it is difficult to apply the method to the inverter system. In addition, because only a differential-mode component is used in this method, a casing leakage current to the ground, that is, a ground-wall insulation leakage current, and a phase-to-phase insulation leakage current are mixed together and indistinguishable. As a result, whether there is aging can only be determined in general, which reduces the monitoring accuracy.

[1] Lee, S. B., et al. (2005). "An online technique for monitoring the insulation condition of AC machine stator windings." IEEE Transactions on Energy Conversion 20: 737-745. In order to monitor fault information before a fault develops, signals that online monitoring equipment needs to measure are generally weak. At the same time, the online monitoring equipment is usually installed in an environment with much electromagnetic interference. This places very high demands on the accuracy of the monitoring equipment and its ability to resist electromagnetic interference.

A conventional monitoring method cannot distinguish the phase-to-phase insulation leakage current from the ground-wall insulation leakage current, which makes it impossible to identify a specific insulation aging position, and even causes misreport of monitoring results. According to actual insulation aging of a motor, the phase-to-phase insulation and the ground-wall insulation are inconsistent in aging speed. Sometimes, the phase-to-phase insulation has been damaged, but the ground-wall insulation has not been damaged. Therefore, it is necessary to distinguish the leakage current of the phase-to-phase insulation from the leakage current of the ground-wall insulation. Moreover, the conventional method cannot be applied to an inverter-driven motor.

Therefore, a heretofore unaddressed need exists in the art to address the aforementioned deficiencies and inadequacies.

SUMMARY

(1) Objective of the Present Invention

Embodiments of the present invention provide a method and device for online insulation monitoring of a motor, and solve the technical problem that a conventional monitoring method can neither be applied to an inverter-driven motor nor identify an insulation aging position.

(2) Technical Solutions

On one hand, an embodiment of the present invention provides a method for on-line insulation monitoring of a motor. The method is applied to an inverter-driven motor system and includes the following steps:

measuring phase-to-ground voltages of three-phase inlet lead ends of a motor;

acquiring leakage currents of the three-phase inlet lead ends of the motor;

acquiring a voltage common-mode component, a voltage differential-mode component, a current common-mode component and a current differential-mode component from the phase-to-ground voltages and the leakage currents; and acquiring ground-wall insulation equivalent capacitance and phase-to-phase insulation equivalent capacitance according to the components.

Further, acquiring the leakage currents of the three-phase inlet lead ends of the motor includes:

measuring the leakage currents by a current transformer installed outside an inlet/outlet cable of each phase.

Further, the step of acquiring the voltage common-mode component, the voltage differential-mode component, the current common-mode component and the current differential-mode component from the phase-to-ground voltages and the leakage currents includes the following step:

performing fast Fourier decomposition on each phase-to-ground voltage or leakage current signal to acquire a voltage common-mode component, a voltage differential-mode component, a current common-mode component and a current differential-mode component.

Further, the step of performing the fast Fourier decomposition on each phase-to-ground voltage or leakage current signal to acquire the voltage common-mode component, the voltage differential-mode component, the current common-mode component and the current differential-mode component includes the following steps: performing fast Fourier decomposition on a measured phase-to-ground voltage or leakage current signal to obtain a spectrogram of the phase-to-ground voltage or leakage current signal; and acquiring common-mode components and differential-mode components according to frequency domain distribution of the common-mode components and the differential-mode components.

Further, the step of acquiring the common-mode components and the differential-mode components according to the frequency domain distribution of the common-mode components and the differential-mode components includes the following steps: selecting a common-mode component frequency and a differential-mode component frequency according to frequency domain distribution of common-mode components and differential-mode components, and acquiring the common-mode components at the common-mode component frequency and the differential-mode components at the differential-mode component frequency.

Further, the common-mode component frequency and the differential-mode component frequency are higher than an inverter switching frequency.

Further, the common-mode component frequency is $f_{CM}=Nf_{switch}$, $N=1, 3, 5 \ldots$, $f_{switch}$ is the inverter switching frequency, the differential-mode component frequency is $f^{DM}=Nf_{switch}\pm 2f_{base}$, $N=2, 4, 6$, and $f_{base}$ is a fundamental frequency.

Further, the step of acquiring the ground-wall insulation equivalent capacitance and the phase-to-phase insulation equivalent capacitance according to the components includes: separating a current differential-mode component into ground-wall insulation leakage current and phase-to-phase insulation leakage current.

Further, the specific formulas for the step of acquiring the ground-wall insulation equivalent capacitance and the phase-to-phase insulation equivalent capacitance according to the components are as follows:

$$C_{ga} = \frac{I_{aICM}}{\omega_{CM} V_{aCM}} \quad (1)$$

$$C_{gb} = \frac{I_{bICM}}{\omega_{CM} V_{bCM}} \quad (2)$$

$$C_{gc} = \frac{I_{cICM}}{\omega_{CM} V_{cCM}} \quad (3)$$

$$\begin{bmatrix} C_{ab1} \\ C_{ac1} \end{bmatrix} = \begin{bmatrix} -\text{Im}(V_{ab}), -\text{Im}(V_{ac}) \\ \text{Re}(V_{ab}), \text{Re}(V_{ac}) \end{bmatrix}^{-1} \begin{bmatrix} \text{Re}\left(\frac{2I_{aIDM}}{\omega_{DM}} - V_{aDM}C_{ga}\right) \\ \text{Im}\left(\frac{2I_{aIDM}}{\omega_{DM}} - V_{aDM}C_{ga}\right) \end{bmatrix} \quad (4)$$

$$\begin{bmatrix} C_{ab2} \\ C_{bc1} \end{bmatrix} = \begin{bmatrix} -\text{Im}(V_{ab}), -\text{Im}(V_{bc}) \\ \text{Re}(V_{ab}), \text{Re}(V_{bc}) \end{bmatrix}^{-1} \begin{bmatrix} \text{Re}\left(\frac{2I_{bIDM}}{\omega_{DM}} - V_{bDM}C_{gb}\right) \\ \text{Im}\left(\frac{2I_{bIDM}}{\omega_{DM}} - V_{bDM}C_{gb}\right) \end{bmatrix} \quad (5)$$

$$\begin{bmatrix} C_{bc2} \\ C_{ac2} \end{bmatrix} = \begin{bmatrix} -\text{Im}(V_{bc}), -\text{Im}(V_{ac}) \\ \text{Re}(V_{bc}), \text{Re}(V_{ac}) \end{bmatrix}^{-1} \begin{bmatrix} \text{Re}\left(\frac{2I_{cIDM}}{\omega_{DM}} - V_{cDM}C_{gc}\right) \\ \text{Im}\left(\frac{2I_{cIDM}}{\omega_{DM}} - V_{cDM}C_{gc}\right) \end{bmatrix} \quad (6)$$

-continued $$C_{ab} = (C_{ab1} + C_{ab2})/2 \qquad (7)$$

$$C_{bc} = (C_{bc1} + C_{bc2})/2 \qquad (8)$$

$$C_{ac} = (C_{ac1} + C_{ac2})/2, \qquad (9)$$

wherein $C_{ga}$, $C_{gb}$ and $C_{gc}$ are phase A-to-ground insulation equivalent capacitance, phase B-to-ground insulation equivalent capacitance, and phase C-to-ground insulation equivalent capacitance respectively; $C_{ab1}$ and $C_{ab2}$ are phase A-to-phase B capacitance obtained according to a phase A measurement result and a phase B measurement result respectively; $C_{ab}$ is a final measurement result of the phase A-to-phase B capacitance and is an average value of $C_{ab1}$ and $C_{ab2}$; $C_{ac1}$ and $C_{ac2}$ are phase A-to-phase C capacitance obtained according to the phase A measurement result and a phase C measurement result respectively; $C_{ac}$ is a final measurement result of the phase A-to-phase C capacitance and is an average value of $C_{ac1}$ and $C_{ac2}$; $C_{bc1}$ and $C_{bc2}$ are phase B-to-phase C capacitance obtained according to the phase B measurement result and the phase C measurement result respectively; $C_{bc}$ is a final measurement result of phase B-to-phase C capacitance and is an average value of $C_{bc1}$ and $C_{bc2}$; $I_{a1CM}$, $I_{b1CM}$ and $I_{c1CM}$ are a phase A current common-mode component, a phase B current common-mode component and a phase C common-mode component respectively; $I_{a1DM}$, $I_{b1DM}$ and $I_{c1DM}$ are a phase A current differential-mode component, a phase B current differential-mode component and a phase C current differential-mode component respectively; $I_{a1DM}$, $I_{b1DM}$ and $I_{c1DM}$ include ground-wall insulation leakage current and phase-to-phase insulation leakage current; $V_{aCM}$, $V_{bCM}$ and $V_{cCM}$ are a phase A-to-ground voltage common-mode component, a phase B-to-ground voltage common-mode component and a phase C-to-ground voltage common-mode component respectively; $V_{aDM}$, $V_{bDM}$ and $V_{cDM}$ are a phase A-to-ground voltage differential-mode component, a phase B-to-ground voltage differential-mode component and a phase C-to-ground voltage differential-mode component respectively; $V_{abDM}$, $V_{acDM}$ and $V_{bcDM}$ are a phase A-to-phase B voltage differential-mode component, a phase A-to-phase C voltage differential-mode component and a phase B-to-phase C voltage differential-mode component respectively; and $\omega_{CM}$ and $\omega_{DM}$ are angular frequencies corresponding to a common-mode component frequency and a differential-mode component frequency.

On the other hand, an embodiment of the present invention provides a device for online insulation monitoring of a motor, applied to an inverter-driven motor system and including:

a voltage detection device (2), configured to measure phase-to-ground voltages of three-phase inlet lead ends of a motor;

a current detection device (1), configured to acquire leakage currents of the three-phase inlet lead ends of the motor; and a control device (7), configured to acquire a voltage common-mode component, a voltage differential-mode component, a current common-mode component and a current differential-mode component from the phase-to-ground voltages and the leakage currents, and to acquire ground-wall insulation equivalent capacitance and phase-to-phase insulation equivalent capacitance according to the components.

(3) Beneficial Effects

The technical solutions of the present invention have the following beneficial effects.

According to the method and device for online insulation monitoring of a motor stator provided by embodiments of the present invention, by measuring the phase voltage and the leakage current of each phase in the inverter-driven motor and performing Fourier analysis on measurement results at a frequency domain by use of the frequency diversity of an output voltage of an inverter, common-mode components and differential-mode components of voltage and current are acquired. When the characteristics of the differential-mode leakage current, i.e. including the ground-wall insulation leakage current and the phase-to-phase insulation leakage current, are discovered, the differential-mode leakage current is separated; the common-mode components and the differential-mode components are combined to obtain the ground-wall insulation equivalent capacitance and the phase-to-phase insulation equivalent capacitance; a ground-wall insulation monitoring result and a phase-to-phase insulation monitoring result are distinguished from each other, such that two kinds of insulation are monitored respectively, and it is possible to acquire an accurate online insulation monitoring result of the stator; and the accuracy of the online insulation monitoring result of the stator and the monitoring reliability are improved. By selecting and shielding a broadband high-accuracy measurement sensor, the device can work normally in the inverter-driven system. For the inverter-driven motor system, accurate monitoring can be performed, which is very important for today's more extensive application of inverters. By selecting a high-frequency range during measurement, electromagnetic interference can be avoided, and the phase voltage and the leakage current of each phase in the inverter-driven motor are accurately measured. Meanwhile, by selecting the high-frequency range, the equivalent insulation impedance of the motor is simplified as equivalent insulation capacitance. Thus, the calculation is simplified further.

BRIEF DESCRIPTION OF THE DRAWINGS

The accompanying drawings illustrate one or more embodiments of the present invention and, together with the written description, serve to explain the principles of the invention. Wherever possible, the same reference numbers are used throughout the drawings to refer to the same or like elements of an embodiment.

Other features, objectives, and advantages of the present invention will become more apparent by reading detailed description of the non-restrictive embodiments with reference to the following drawings:

FIG. 1(a) illustrates an insulation equivalent circuit, and FIG. 1(b) is a current phase diagram;

DETAILED DESCRIPTION

To make objectives, technical solutions, and advantages of the present invention clearer, the followings will further describe the present invention in detail with reference to specific implementation modes and the accompanying drawings. It should be understood that these descriptions are merely exemplary and are not intended to limit the scope of the present invention. In addition, in the followings, descriptions of known structures and technologies are omitted to avoid unnecessarily obscuring the concept of the present invention.

The motor in the present invention may be an AC motor applied to equipment such as water pumps, machine tools and compressors, or an AC motor applied to wind power, electric vehicles, etc.

Figure 1:
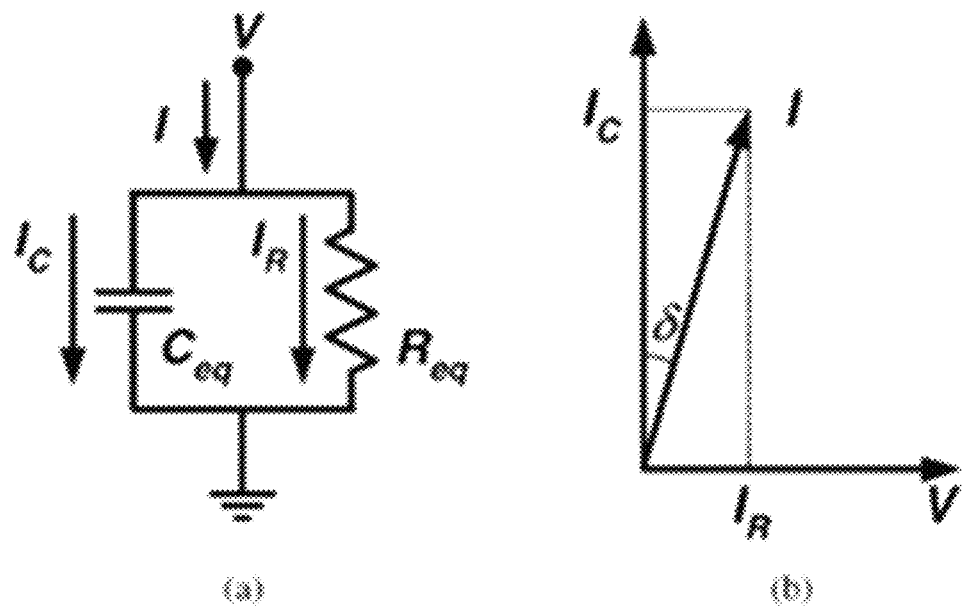
FIG. 1 is a schematic diagram showing monitoring of an insulation health condition of a motor stator winding in the prior art.
Figure 2:
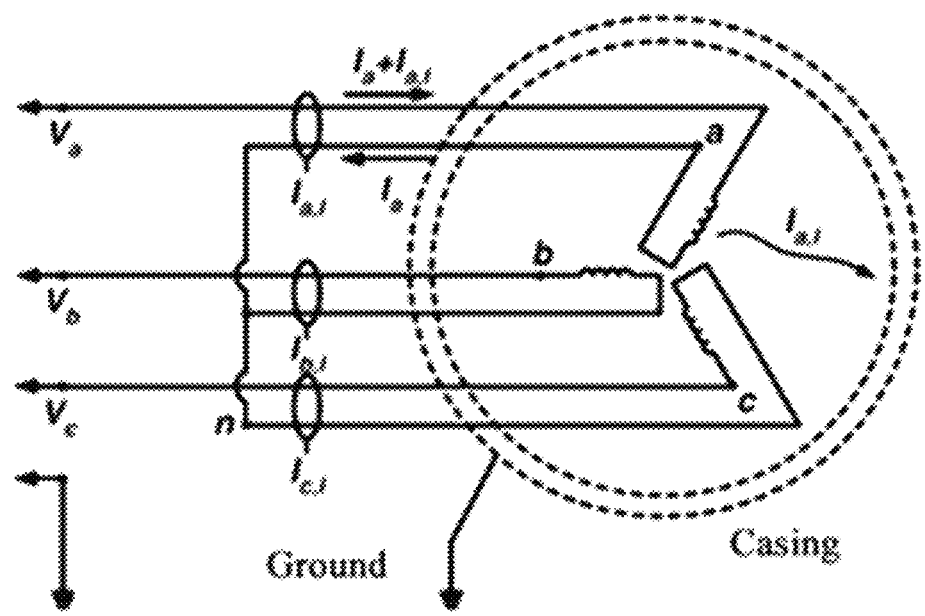
FIG. 2 is a structural diagram of online insulation monitoring based on differential-mode current in the prior art.
Figure 3:
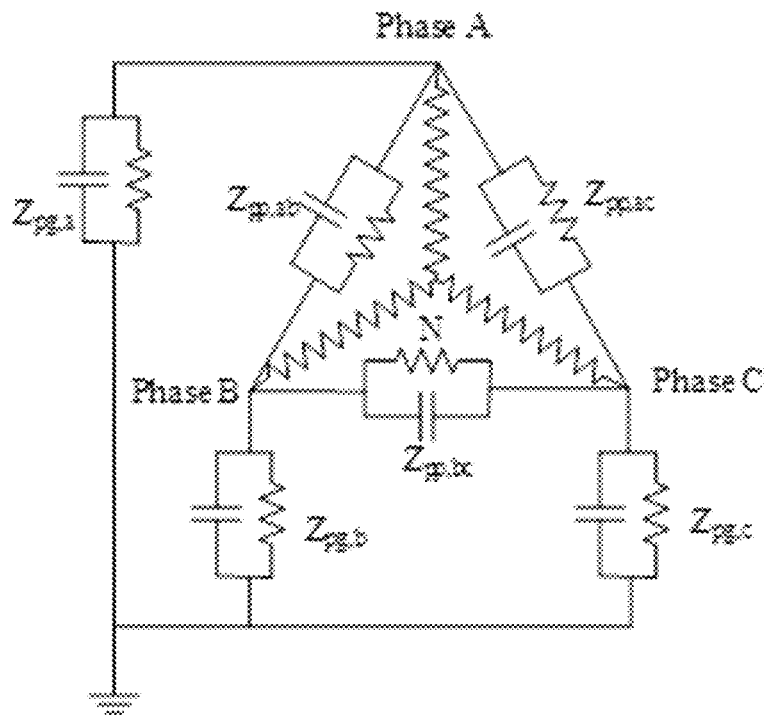
FIG. 3 is a diagram showing an equivalent insulation model provided by a specific embodiment of the present invention.

FIG. 3 is a diagram showing an equivalent insulation model of a stator insulation system of a three-phase AC motor provided by an embodiment of the present invention. For the three-phase AC motor, the stator insulation system thereof may be regarded as the equivalent model in FIG. 3, in which N is a neutral. There is an insulation structure equivalent to resistance and capacitance parallel connection between phases A, B, and C. The equivalent impedance of a phase A-to-phase B insulation structure is $Z_{pp,ab}$, the equivalent impedance of a phase A-to-phase C insulation structure is $Z_{pp,ac}$, and the equivalent impedance of a phase B-to-phase C insulation structure is $Z_{pp,bc}$. There are same equivalent insulation structures between any one of the three phases and the ground. The equivalent impedance of a phase A-to-ground insulation structure is $Z_{pg,a}$, the equivalent impedance of a phase B-to-ground insulation structure is $Z_{pg,b}$, and the equivalent impedance of a phase C-to-ground insulation structure is $Z_{pg,c}$. Resistance reflects loss caused by leakage current and a polarization process. Capacitance reflects changes in a physical structure of the insulation, including area and thickness of the insulation, existence of gaps, voids, etc. By monitoring the voltages applied to two ends of the insulation and insulation leakage current caused thereby, the equivalent insulation impedance can be worked out. The equivalent insulation resistance of the motor has a typical parameter of hundreds of megaohms, and its equivalent insulation capacitance has a typical parameter of several nanofarads to tens of nanofarads. At a low frequency, a resistive component and a capacitive component of the insulation leakage current are close in magnitude and both of them need to be considered. Since the capacitive leakage current increases proportionally with the frequency, and the resistive leakage current does not increase significantly with the frequency, the capacitive leakage current is much higher than the resistive leakage current at a high frequency. Thus, at the high frequency, only the equivalent insulation in the equivalent impedance of the insulation needs to be considered. In an inverter-driven motor system, electromagnetic interference is serious. The leakage current at a low frequency is very low, at microampere, and thus is difficult to measure accurately. Therefore, in one embodiment of the present invention, the leakage current and the corresponding voltage are measured at a high frequency, and the equivalent insulation capacitance is worked out to realize insulation monitoring. According to experimental results of related literature, as the insulation ages, the equivalent capacitance of the insulation will continue to decrease. When the equivalent insulation is reduced by more than 20%, it is generally considered that the insulation has already been aged severely. According to one embodiment of the present invention, when serious aging is monitored, the equipment is maintained and replaced to avoid a motor failure caused by an insulation failure and to improve the running safety and reliability of the power equipment.

Further, according to one embodiment of the present invention, in order to monitor the phase-to-phase insulation and the ground-wall insulation separately, it is necessary to obtain ground-wall insulation equivalent capacitance and phase-to-phase insulation equivalent capacitance. By independently analyzing the values of the ground-wall insulation equivalent capacitance and the phase-to-phase insulation equivalent capacitance, the ground-wall insulation and the phase-to-phase insulation can be reflected respectively.

The process of obtaining the ground-wall insulation equivalent capacitance and the phase-to-phase insulation equivalent capacitance will be described in detail below with reference to the circuit device of the present invention.

Figure 4:
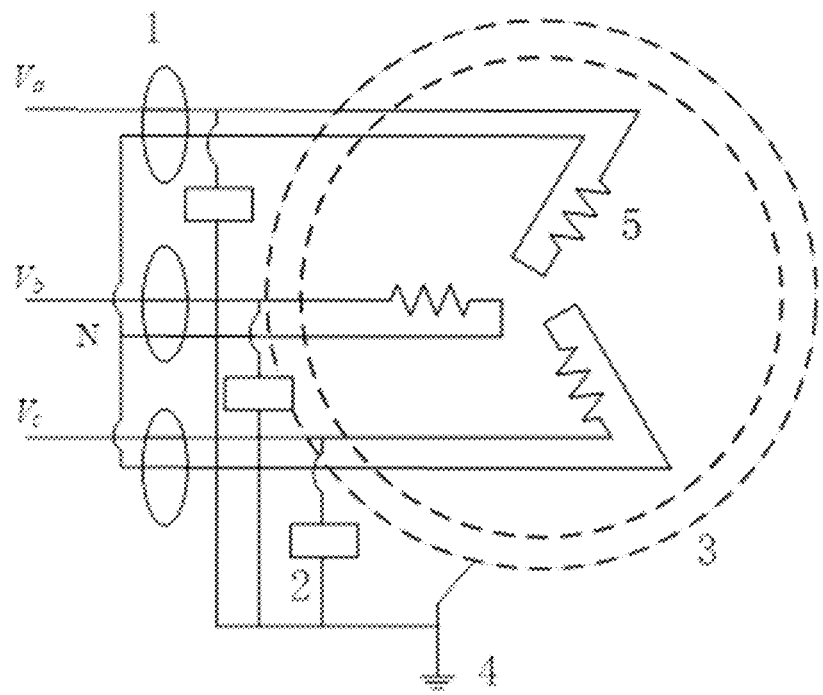
FIG. 4 is a structural diagram of a motor-side circuit provided by a specific embodiment of the present invention.
Figure 5:
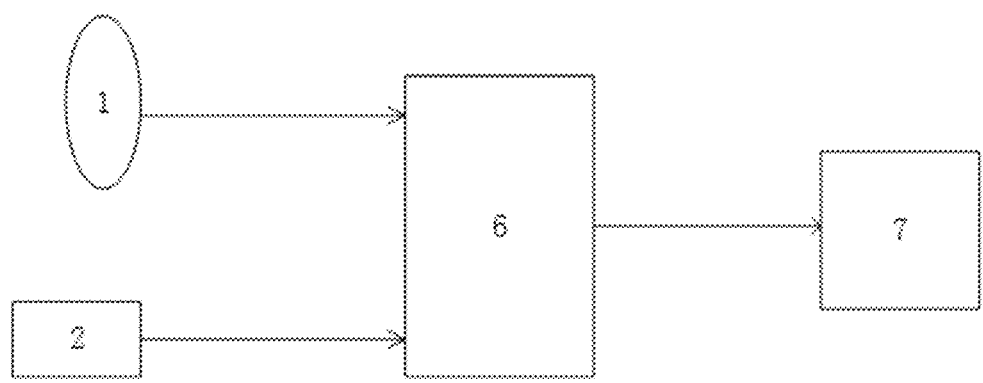
FIG. 5 is a structural diagram of a control circuit provided by a specific embodiment of the present invention.

As shown in FIGS. 4 and 5, the motor of the present invention includes a casing 3 and a stator winding 5. The casing 3 is connected to the ground 4. A device for online insulation monitoring of a stator includes a current detection device 1, a voltage detection device 2, a data collector 6 and a control device 7.

The current detection device 1 may be a detection apparatus such as a CT (Current transformer) and a current probe. The voltage detection device 2 may be a detection apparatus such as a VT (Voltage Transformer), and a voltage probe. The data collector 6 may be a signal processing circuit, an AD conversion circuit, etc. The control device 7 may include a single-chip microcomputer, an MCU (Microprogrammed Control Unit), or a CPU (Central Processing Unit).

Preferably, the VT shall have a frequency bandwidth of 200 kHz or above, a measuring range of 700 V and an accuracy of not lower than 1 V. Preferably, the CT should have a frequency bandwidth of 200 kHz or above, a measuring range of 2 A and an accuracy of not lower than 1 mA. Besides, the two transformers should be well shielded to avoid errors caused by electromagnetic interference.

Further, the voltage detection devices 2 are mounted at a three-phase inlet lead ends of the motor and configured to measure each phase-to-ground voltage. A voltage signal measured by the voltage detection device 2 is collected by the data collector 6, and subjected to fast Fourier decomposition analysis in the control device 7 to obtain a voltage common-mode component (namely, a common-mode voltage) and a voltage differential-mode component (namely, a differential-mode voltage).

Further, the current detection device 1 is configured to obtain leakage current of each phase. The current detection device 1 is preferably a CT installed outside an inlet/outlet cable of each phase. In this way, load currents getting in and out cancel each other. The CT can only measure the leakage current. The leakage current includes common-mode leakage current (i.e., a current common-mode component) and differential-mode leakage current (i.e., a current differential-mode component).

The common-mode component refers to the same portion of the three-phase physical quantity (such as voltage or current), and the differential-mode component refers to the portion in the three-phase physical quantity other than the common-mode component. Common-mode voltage generates common-mode leakage current, and differential-mode voltage generates differential-mode leakage current. Distribution of the common-mode component and the differential-mode component is affected by a modulation method of an inverter. The distribution of the common-mode component and the differential-mode component in the frequency domain can be obtained through experimental measurements. Experimental results show that the common-mode component and the differential-mode component are distributed differently in the frequency domain. At a certain frequency, only the common-mode component or the differential-mode component can be included. In a common DPWM (Digital Pulse Width Modulation) mode, the frequency of the common-mode component is $f_{CM}=Nf_{switch}$, $N=1, 3, 5 \ldots$, $f_{switch}$ is the inverter switching frequency; and the frequency of the differential-mode component is $f_{DM}=Nf_{switch} \pm 2 f_{base}$, $N=2, 4, 6$, and $f_{base}$ is a fundamental frequency. In other PWM (Pulse Width Modulation) modes, a user needs to perform spectrum analysis by measuring the phase-to-ground voltages of the three phases and using fast Fourier transform. In the frequency spectrum, frequency components with the same phase for the three phases are the common-mode components, and the frequency components of which the phase difference is 120 degrees are the differential-mode components, such that the spectrum distribution of the common-mode voltage and the differential-mode voltage are determined. After the modulation method of the inverter is determined, the frequency domain distribution of the common-mode component and the differential-mode component can be measured through simulation or experiments. Then, during monitoring, fast Fourier decomposition is performed on a measured voltage or current signal to obtain a spectrum diagram of the voltage or current signal. According to the frequency domain distribution of the common-mode component and the differential-mode component, the magnitudes of the common-mode component and the differential-mode component at different frequencies are determined. Further, the corresponding equivalent insulation impedance is calculated. The common-mode voltage is divided by common-mode leakage current to obtain common-mode equivalent impedance, and the differential-mode voltage is divided by differential-mode leakage current to obtain differential-mode equivalent impedance. The current signal measured by the current detection device 1 is collected by the data collector 6 and subjected to fast Fourier decomposition analysis in the control device 7 to obtain the current common-mode component and the current differential-mode component, namely, a common-mode leakage current and a differential-mode leakage current. The common-mode leakage current only includes the ground-wall insulation leakage current, and the differential-mode leakage current includes the phase-to-phase insulation leakage current in addition to the ground-wall insulation leakage current. The common-mode leakage current, namely, the ground-wall insulation leakage current, is subtracted from the differential-mode leakage current to obtain the phase-to-phase leakage current.

Since the measured common-mode component and differential-mode component are mainly distributed within a range of frequencies higher than the inverter switching frequency, analysis is made within this frequency range. In this frequency range, the insulation leakage current is mainly composed of capacitive leakage current. Therefore, insulation may be equivalent to capacitance, and the common-mode insulation leakage current and the differential-mode insulation leakage current can be obtained by taking phase A as an example. The relationship between the common-mode and differential-mode voltages and equivalent insulation parameters is as shown in formulas (1) and (2). Similarly, the same formulas (3) to (6) can be obtained for phases B and C:

$$I_{a1CM}=\omega_{CM}V_{aCM}C_{ga} \tag{1}$$

$$I_{a1DM}=0.5\omega_{DM}V_{aDM}C_{ga}+0.5\omega_{DM}V_{abDM}C_{ab}+ \\ 0.5\omega_{DM}V_{acDM}C_{ac} \tag{2}$$

$$I_{c1CM}=\omega_{CM}V_{bCM}C_{gb} \tag{3}$$

$$I_{b1DM}=0.5\omega_{DM}V_{bDM}C_{gb}+0.5\omega_{DM}V_{abDM}C_{ab}+ \\ 0.5\omega_{DM}V_{bcDM}C_{bc} \tag{4}$$

$$I_{c1CM}=\omega_{CM}V_{cCM}C_{gc} \tag{5}$$

$$I_{c1DM}=0.5\omega_{DM}V_{cDM}C_{gc}+0.5\omega_{DM}V_{bcDM}C_{bc}+ \\ 0.5\omega_{DM}V_{acDM}C_{ac} \tag{6}$$

Formulas (1), (3), and (5) show the relationship between the common-mode leakage current and the phase-to-ground insulation equivalent capacitance. Formulas (2), (4), and (6) show the relationship between the differential-mode leakage current and the phase-to-ground and phase-to-phase equivalent capacitance, where the first item is the phase-to-ground leakage current and the last two items are the phase A-to-phase B leakage current and the phase A-to-phase C leakage current. $I_{a1CM}$, $I_{b1CM}$ and $I_{c1CM}$ are common-mode components in the leakage currents of phases A, B and C measured by the CT 1 in FIG. 4, namely a phase A common-mode leakage current, a phase B common-mode leakage current and a phase C common-mode leakage current. $I_{a1DM}$, $I_{b1DM}$ and $I_{c1DM}$ are differential-mode components in the leakage currents of phase A, B and C measured by the CT 1 in FIG. 4, namely, a phase A differential-mode leakage current, a phase B differential-mode leakage current, and a phase C differential-mode leakage current, which include ground-wall insulation leakage current and phase-to-phase insulation leakage current required to be separated by follow-up calculation. $C_{ga}$, $C_{gb}$ and $C_{gc}$ are phase A-to-ground insulation equivalent capacitance, phase B-to-ground insulation equivalent capacitance and phase C-to-ground insulation equivalent capacitance. $C_{ab}$, $C_{ac}$ and $C_{bc}$ are phase A-to-phase B equivalent capacitance, phase A-to-phase C equivalent capacitance and phase B-to-phase C equivalent capacitance respectively. $V_{aCM}$, $V_{bCM}$ and $V_{cCM}$ are phase A-to-ground common-mode voltage, phase B-to-ground common-mode voltage and phase C-to-ground common-mode voltage respectively. $V_{aDM}$, $V_{bDM}$ and $V_{cDM}$ are phase A-to-ground differential-mode voltage, phase B-to-ground differential-mode voltage and phase C-to-ground differential-mode voltage respectively. $V_{abDM}$, $V_{acDM}$ and $V_{bcDM}$ are phase A-to-phase B differential-mode voltage phase A-to-phase C differential-mode voltage and phase B-to-phase C differential-mode voltage respectively. $\omega_{CM}$ and $\omega_{DM}$ are angular frequencies corresponding to a common-mode component frequency and a differential-mode component frequency.

According to formulas (1) to (6), the following results can be derived (Re is the real part and Im is the imaginary part):

$$C_{ga}=\frac{I_{a1CM}}{\omega_{CM}V_{aCM}} \tag{7}$$

$$C_{gb}=\frac{I_{b1CM}}{\omega_{CM}V_{bCM}} \tag{8}$$

$$C_{gc}=\frac{I_{c1CM}}{\omega_{CM}V_{cCM}} \tag{9}$$

$$\frac{2I_{a1DM}}{\omega_{DM}}-V_{aDM}C_{ga}=V_{abDM}C_{ab}+V_{acDM}C_{ac} \tag{10}$$

-continued $$\frac{2I_{bIDM}}{\omega_{DM}} - V_{bDM}C_{gb} = V_{abDM}C_{ab} + V_{bcDM}C_{bc} \quad (11)$$

$$\frac{2I_{cIDM}}{\omega_{DM}} - V_{cDM}C_{gc} = V_{bcDM}C_{bc} + V_{acDM}C_{ac} \quad (12)$$

$$\begin{bmatrix} C_{ab1} \\ C_{ac1} \end{bmatrix} = \begin{bmatrix} -\text{Im}(V_{ab}), -\text{Im}(V_{ac}) \\ \text{Re}(V_{ab}), \text{Re}(V_{ac}) \end{bmatrix}^{-1} \begin{bmatrix} \text{Re}\left(\frac{2I_{aIDM}}{\omega_{DM}} - V_{aDM}C_{ga}\right) \\ \text{Im}\left(\frac{2I_{aIDM}}{\omega_{DM}} - V_{aDM}C_{ga}\right) \end{bmatrix} \quad (13)$$

$$\begin{bmatrix} C_{ab2} \\ C_{bc1} \end{bmatrix} = \begin{bmatrix} -\text{Im}(V_{ab}), -\text{Im}(V_{bc}) \\ \text{Re}(V_{ab}), \text{Re}(V_{bc}) \end{bmatrix}^{-1} \begin{bmatrix} \text{Re}\left(\frac{2I_{bIDM}}{\omega_{DM}} - V_{bDM}C_{gb}\right) \\ \text{Im}\left(\frac{2I_{bIDM}}{\omega_{DM}} - V_{bDM}C_{gb}\right) \end{bmatrix} \quad (14)$$

$$\begin{bmatrix} C_{bc2} \\ C_{ac2} \end{bmatrix} = \begin{bmatrix} -\text{Im}(V_{bc}), -\text{Im}(V_{ac}) \\ \text{Re}(V_{bc}), \text{Re}(V_{ac}) \end{bmatrix}^{-1} \begin{bmatrix} \text{Re}\left(\frac{2I_{cIDM}}{\omega_{DM}} - V_{cDM}C_{gc}\right) \\ \text{Im}\left(\frac{2I_{cIDM}}{\omega_{DM}} - V_{cDM}C_{gc}\right) \end{bmatrix} \quad (15)$$

$$C_{ab} = (C_{ab1} + C_{ab2})/2 \quad (16)$$

$$C_{bc} = (C_{bc1} + C_{bc2})/2 \quad (17)$$

$$C_{ac} = (C_{ac1} + C_{ac2})/2. \quad (18)$$

That is, the ground-wall insulation equivalent capacitance is obtained by the formulas (7) to (9) and substituted into formulas (2), (4) and (6) to obtain formulas (10) to (12). On the right side of the formulas (10) to (12) are phase-to-phase leakage current obtained by subtracting the phase-to-ground differential-mode leakage current from the differential-mode leakage current. Since the real part and the imaginary part on two sides of the equation are equal, the phase-to-phase insulation equivalent capacitance of the phases can be obtained from measurement results of the phases in formulas (13) to (15). $C_{ab1}$ and $C_{ab2}$ are phase A-to-phase B capacitance obtained according to a phase A measurement result and a phase B measurement result respectively, and in theory, they should be equal. Due to a measurement error, the actual measurement results will be slightly different, so it is recommended to take the average of the two as the final measurement result $C_{ab}$. Similarly, $C_{ac1}$, $C_{ac2}$, and $C_{ac}$ are phase A-to-phase C capacitance obtained according to the phase A measurement result, a phase C measurement result and their average value. $C_{bc1}$, $C_{bc2}$, and $C_{bc}$ are phase B-to-phase C capacitance obtained according to the phase B measurement result, a phase C measurement result and their average value. The finally averaged phase-to-phase insulation equivalent capacitance in formulas (16) to (18) is obtained by taking the average value.

Generally, reduction of the equivalent insulation capacitance reflects aging of the insulation. Relevant literature data shows that when the insulation equivalent capacitance is reduced by more than 20%, it can be considered that the insulation ages severely and the equipment needs to be maintained and replaced. Therefore, after acquiring the ground-wall insulation equivalent capacitance and the phase-to-phase insulation equivalent capacitance, whether the capacitance ages may be determined according to changes of the capacitance value for the purpose of equipment maintenance and replacement.

In summary, the method and device for online insulation monitoring of the motor are applied to the inverter-driven motor system. The method includes: measuring phase-to-ground voltages of three-phase inlet lead ends of a motor; acquiring leakage currents of the three-phase inlet lead ends of the motor; acquiring a voltage common-mode component, a voltage differential-mode component, a current common-mode component and a current differential-mode component from the phase-to-ground voltages and the leakage currents; and acquiring ground-wall insulation equivalent capacitance and phase-to-phase insulation equivalent capacitance according to the components. The ground-wall insulation monitoring result and the phase-to-phase insulation monitoring result are distinguished from each other by the obtained ground-wall insulation equivalent capacitance and phase-to-phase insulation equivalent capacitance, such that two kinds of insulation are monitored respectively. Further, the accuracy of the online insulation monitoring result of the stator and the monitoring reliability are improved.

It should be understood that the foregoing specific implementation modes of the present invention are only used to exemplarily illustrate or explain the principles of the present invention, and do not constitute a limitation to the present invention. Therefore, any modifications, equivalent substitutions, improvements, etc. made without departing from the spirit and scope of the present invention should be included in the protection scope of the present invention. Besides, the appended claims of the present invention are intended to cover all change and modification examples that fall within the scope and boundary of the appended claims, or equivalent forms of such range and boundary.

The foregoing description of the exemplary embodiments of the present invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A method for online insulation monitoring of a motor, applied to an inverter-driven motor system, and comprising:

measuring phase-to-ground voltages of three-phase inlet lead ends of a motor;

acquiring leakage currents of the three-phase inlet lead ends of the motor;

acquiring a voltage common-mode component, a voltage differential-mode component, a current common-mode component and a current differential-mode component from the phase-to-ground voltages and the leakage currents; and acquiring ground-wall insulation equivalent capacitance and phase-to-phase insulation equivalent capacitance according to the components;

wherein the specific formulas for the step of acquiring the ground-wall insulation equivalent capacitance and the phase-to-phase insulation equivalent capacitance according to the components are as follows:

$$C_{ga} = \frac{I_{aICM}}{\omega_{CM} V_{aCM}} \quad (1)$$

-continued $$C_{gb} = \frac{I_{blCM}}{\omega_{CM} V_{bCM}} \quad (2)$$

$$C_{gc} = \frac{I_{clCM}}{\omega_{CM} V_{cCM}} \quad (3)$$

$$\begin{bmatrix} C_{ab1} \\ C_{ac1} \end{bmatrix} = \begin{bmatrix} -\text{Im}(V_{ab}), -\text{Im}(V_{ac}) \\ \text{Re}(V_{ab}), \text{Re}(V_{ac}) \end{bmatrix}^{-1} \begin{bmatrix} \text{Re}\left(\frac{2I_{alDM}}{\omega_{DM}} - V_{aDM} C_{ga}\right) \\ \text{Im}\left(\frac{2I_{alDM}}{\omega_{DM}} - V_{aDM} C_{ga}\right) \end{bmatrix} \quad (4)$$

$$\begin{bmatrix} C_{ab2} \\ C_{bc1} \end{bmatrix} = \begin{bmatrix} -\text{Im}(V_{ab}), -\text{Im}(V_{bc}) \\ \text{Re}(V_{ab}), \text{Re}(V_{bc}) \end{bmatrix}^{-1} \begin{bmatrix} \text{Re}\left(\frac{2I_{blDM}}{\omega_{DM}} - V_{bDM} C_{gb}\right) \\ \text{Im}\left(\frac{2I_{blDM}}{\omega_{DM}} - V_{bDM} C_{gb}\right) \end{bmatrix} \quad (5)$$

$$\begin{bmatrix} C_{bc2} \\ C_{ac2} \end{bmatrix} = \begin{bmatrix} -\text{Im}(V_{bc}), -\text{Im}(V_{ac}) \\ \text{Re}(V_{bc}), \text{Re}(V_{ac}) \end{bmatrix}^{-1} \begin{bmatrix} \text{Re}\left(\frac{2I_{clDM}}{\omega_{DM}} - V_{cDM} C_{gc}\right) \\ \text{Im}\left(\frac{2I_{clDM}}{\omega_{DM}} - V_{cDM} C_{gc}\right) \end{bmatrix} \quad (6)$$

$$C_{ab} = (C_{ab1} + C_{ab2})/2 \quad (7)$$

$$C_{bc} = (C_{bc1} + C_{bc2})/2 \quad (8)$$

$$C_{ac} = (C_{ac1} + C_{ac2})/2, \quad (9)$$

wherein $C_{ga}$, $C_{gb}$ and $C_{gc}$ are phase A-to-ground insulation equivalent capacitance, phase B-to-ground insulation equivalent capacitance, and phase C-to-ground insulation equivalent capacitance respectively; $C_{ab1}$ and $C_{ab2}$ are phase A-to-phase B capacitance obtained according to a phase A measurement result and a phase B measurement result respectively; $C_{ab}$ is a final measurement result of the phase A-to-phase B capacitance and is an average value of $C_{ab1}$ and $C_{ab2}$; $C_{ac1}$ and $C_{ac2}$ are phase A-to-phase C capacitance obtained according to the phase A measurement result and a phase C measurement result respectively; $C_{ac}$ is a final measurement result of the phase A-to-phase C capacitance and is an average value of $C_{ac1}$ and $C_{ac2}$; $C_{bc1}$ and $C_{bc2}$ are phase B-to-phase C capacitance obtained according to the phase B measurement result and the phase C measurement result respectively; $C_{bc}$ is a final measurement result of phase B-to-phase C capacitance and is an average value of $C_{bc1}$ and $C_{bc2}$; $I_{a1CM}$, $I_{b1CM}$ and $I_{c1CM}$ are a phase A current common-mode component, a phase B current common-mode component and a phase C common-mode component respectively; $I_{a1DM}$, $I_{b1DM}$ and $I_{c1DM}$ are a phase A current differential-mode component, a phase B current differential-mode component and a phase C current differential-mode component respectively; $I_{a1DM}$, $I_{b1DM}$ and $I_{c1DM}$ include ground-wall insulation leakage current and phase-to-phase insulation leakage current; $V_{aCM}$, $V_{bCM}$ and $V_{cCM}$ are a phase A-to-ground voltage common-mode component, a phase B-to-ground voltage common-mode component and a phase C-to-ground voltage common-mode component respectively; $V_{aDM}$, $V_{bDM}$ and $V_{cDm}$ are a phase A-to-ground voltage differential-mode component, a phase B-to-ground voltage differential-mode component and a phase C-to-ground voltage differential-mode component respectively; $V_{abDM}$, $V_{acDM}$ and $V_{bcDM}$ are a phase A-to-phase B voltage differential-mode component, a phase A-to-phase C voltage differential-mode component and a phase B-to-phase C voltage differential-mode component respectively; and $\omega_{CM}$ and $\omega_{DM}$ are angular frequencies corresponding to a common-mode component frequency and a differential-mode component frequency.

2. The method for online insulation monitoring of the motor according to claim 1, wherein acquiring the leakage currents of the three-phase inlet lead ends of the motor comprises:
measuring the leakage currents by a current transformer installed outside an inlet/outlet cable of each phase.

3. The method for online insulation monitoring of the motor according to claim 1, wherein the step of acquiring the voltage common-mode component, the voltage differential-mode component, the current common-mode component and the current differential-mode component from the phase-to-ground voltages and the leakage currents comprises the following step:
performing fast Fourier decomposition on each phase-to-ground voltage or leakage current signal to acquire a voltage common-mode component, a voltage differential-mode component, a current common-mode component and a current differential-mode component.

4. The method for online insulation monitoring of the motor according to claim 3, wherein the step of performing fast Fourier decomposition on each phase-to-ground voltage or leakage current signal to acquire the voltage common-mode component, the voltage differential-mode component, the current common-mode component and the current differential-mode component comprises the following steps: performing fast Fourier decomposition on a measured phase-to-ground voltage or leakage current signal to obtain a spectrogram of the phase-to-ground voltage or leakage current signal; and acquiring common-mode components and differential-mode components according to frequency domain distribution of the common-mode components and the differential-mode components.

5. The method for online insulation monitoring of the motor according to claim 4, wherein the step of acquiring the common-mode components and the differential-mode components according to the frequency domain distribution of the common-mode components and the differential-mode components comprises the following steps: selecting a common-mode component frequency and a differential-mode component frequency according to frequency domain distribution of common-mode components and differential-mode components, and acquiring the common-mode components at the common-mode component frequency and the differential-mode components at the differential-mode component frequency.

6. The method for online insulation monitoring of the motor according to claim 5, wherein the common-mode component frequency and the differential-mode component frequency are higher than an inverter switching frequency.

7. The method for online insulation monitoring of the motor according to claim 6, wherein the common-mode component frequency is $f_{CM}=Nf_{switch}$, N=1, 3, 5. . . , $f_{switch}$ is the inverter switching frequency, the differential-mode component frequency is $f_{DM}=Nf_{switch}\pm 2f_{base}$, N=2, 4, 6, and $f_{base}$ is a fundamental frequency.

8. The method for online insulation monitoring of the motor according to claim 5, wherein the common-mode component frequency is $f_{CM}=Nf_{switch}$, N=1, 3, 5. . . , $f_{switch}$ is the inverter switching frequency, the differential-mode component frequency is $f_{DM}=Nf_{switch}\pm 2f_{base}$, N=2,4,6, and $f_{base}$ is a fundamental frequency.

9. The method for online insulation monitoring of the motor according to claim 1, wherein the step of acquiring the ground-wall insulation equivalent capacitance and the phase-to-phase insulation equivalent capacitance according to the components comprises: separating a current differential-mode component into ground-wall insulation leakage current and phase-to-phase insulation leakage current.

10. The method for online insulation monitoring of the motor according to claim 1, wherein acquiring the leakage currents of the three-phase inlet lead ends of the motor comprises:

measuring the leakage currents by a current transformer installed outside an inlet/outlet cable of each phase.

11. The method for online insulation monitoring of the motor according to claim 1, wherein the step of acquiring the voltage common-mode component, the voltage differential-mode component, the current common-mode component and the current differential-mode component from the phase-to-ground voltages and the leakage currents comprises the following step:

performing fast Fourier decomposition on each phase-to-ground voltage or leakage current signal to acquire a voltage common-mode component, a voltage differential-mode component, a current common-mode component and a current differential-mode component.

12. The method for online insulation monitoring of the motor according to claim 11, wherein the step of performing fast Fourier decomposition on each phase-to-ground voltage or leakage current signal to acquire the voltage common-mode component, the voltage differential-mode component, the current common-mode component and the current differential-mode component comprises the following steps: performing fast Fourier decomposition on a measured phase-to-ground voltage or leakage current signal to obtain a spectrogram of the phase-to-ground voltage or leakage current signal; and acquiring common-mode components and differential-mode components according to frequency domain distribution of the common-mode components and the differential-mode components.

13. The method for online insulation monitoring of the motor according to claim 12, wherein the step of acquiring the common-mode components and the differential-mode components according to the frequency domain distribution of the common-mode components and the differential-mode components comprises the following steps: selecting a common-mode component frequency and a differential-mode component frequency according to frequency domain distribution of common-mode components and differential-mode components, and acquiring the common-mode components at the common-mode component frequency and the differential-mode components at the differential-mode component frequency.

14. The method for online insulation monitoring of the motor according to claim 13, wherein the common-mode component frequency and the differential-mode component frequency are higher than an inverter switching frequency.

15. The method for online insulation monitoring of the motor according to claim 14, wherein the common-mode component frequency is $f_{CM}=Nf_{switch}$, N=1, 3, 5..., $f_{switch}$ is the inverter switching frequency, the differential-mode component frequency is $f_{DM}=Nf_{switch} \pm 2f_{base}$, N =2, 4, 6, and $f_{base}$ is a fundamental frequency.

16. The method for online insulation monitoring of the motor according to claim 13, wherein the common-mode component frequency is $fCM=Nf_{switch}$, N=1, 3, 5..., $f_{switch}$ is the inverter switching frequency, the differential-mode component frequency is $f_{DM} =Nf_{switch} \pm 2 f_{base}$, N=2, 4, 6, and $f_{base}$ is a fundamental frequency.

17. The method for online insulation monitoring of the motor according to claim 1, wherein the step of acquiring the ground-wall insulation equivalent capacitance and the phase-to-phase insulation equivalent capacitance according to the components comprises: separating a current differential-mode component into ground-wall insulation leakage current and phase-to-phase insulation leakage current.

\* \* \* \* \*